United States Patent
Huang et al.

(10) Patent No.: US 9,196,862 B2
(45) Date of Patent: Nov. 24, 2015

(54) DISPLAY DEVICE AND ASSEMBLY METHOD THEREOF

(75) Inventors: Yu-Chun Huang, Hsin-Chu (TW); Chia-Chun Chang, Hsin-Chu (TW); Hong-Shen Lin, Hsin-Chu (TW)

(73) Assignee: AU OPTRONICS CORP., Hsin-Chu (TW)

( * ) Notice: Subject to any disclaimer, the term of this patent is extended or adjusted under 35 U.S.C. 154(b) by 552 days.

(21) Appl. No.: 13/541,866

(22) Filed: Jul. 5, 2012

(65) Prior Publication Data
US 2013/0163204 A1   Jun. 27, 2013

(30) Foreign Application Priority Data
Dec. 23, 2011   (TW) .............................. 100148425 A

(51) Int. Cl.
*H01L 51/52* (2006.01)
*H01L 27/32* (2006.01)
*H05K 7/20* (2006.01)

(52) U.S. Cl.
CPC ........ *H01L 51/5237* (2013.01); *H01L 27/3276* (2013.01); *H01L 51/529* (2013.01); *H05K 7/20963* (2013.01); *Y10T 29/49826* (2015.01)

(58) Field of Classification Search
None
See application file for complete search history.

(56) References Cited

U.S. PATENT DOCUMENTS

| | | | |
|---|---|---|---|
| 7,235,922 B2 * | 6/2007 | Jun et al. | 313/582 |
| 2004/0100601 A1 * | 5/2004 | Iwase et al. | 349/122 |
| 2005/0062382 A1 * | 3/2005 | Kim et al. | 313/44 |
| 2005/0077822 A1 | 4/2005 | Kim et al. | |
| 2006/0125407 A1 * | 6/2006 | Jeong | 315/169.3 |
| 2006/0154498 A1 | 7/2006 | Jeong et al. | |
| 2006/0166588 A1 | 7/2006 | Kong et al. | |
| 2010/0156763 A1 | 6/2010 | Lee et al. | |
| 2010/0244005 A1 | 9/2010 | Gyoda | |

FOREIGN PATENT DOCUMENTS

| | | |
|---|---|---|
| CN | 1809263 A | 7/2006 |
| CN | 100488342 C | 7/2006 |
| CN | 101763777 A | 6/2010 |
| TW | 201106772 | 2/2011 |
| TW | 201106772 A | 2/2011 |

OTHER PUBLICATIONS

Taiwan Patent Office, "Office Action", Feb. 27, 2014.
China Patent Office, "Office Action", Jan. 16, 2014.

* cited by examiner

*Primary Examiner* — Richard Kim
(74) *Attorney, Agent, or Firm* — WPAT, PC; Justin King

(57) ABSTRACT

A display device includes a rear bezel, a display panel and at least two heat dissipation sheets. The display panel is disposed on the rear bezel. The display panel includes at least one power line having an extension direction. The heat dissipation sheets are disposed between the rear bezel and the display panel. The heat dissipation sheets have at least one seam formed therebetween. The at least one seam is substantially parallel to the extension direction of the at least one power line.

17 Claims, 5 Drawing Sheets

Figure 1:
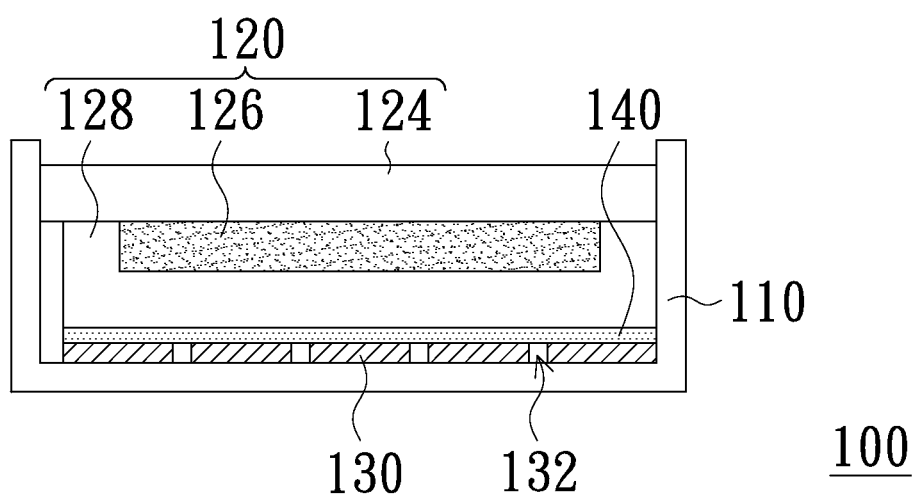
Figure 2:
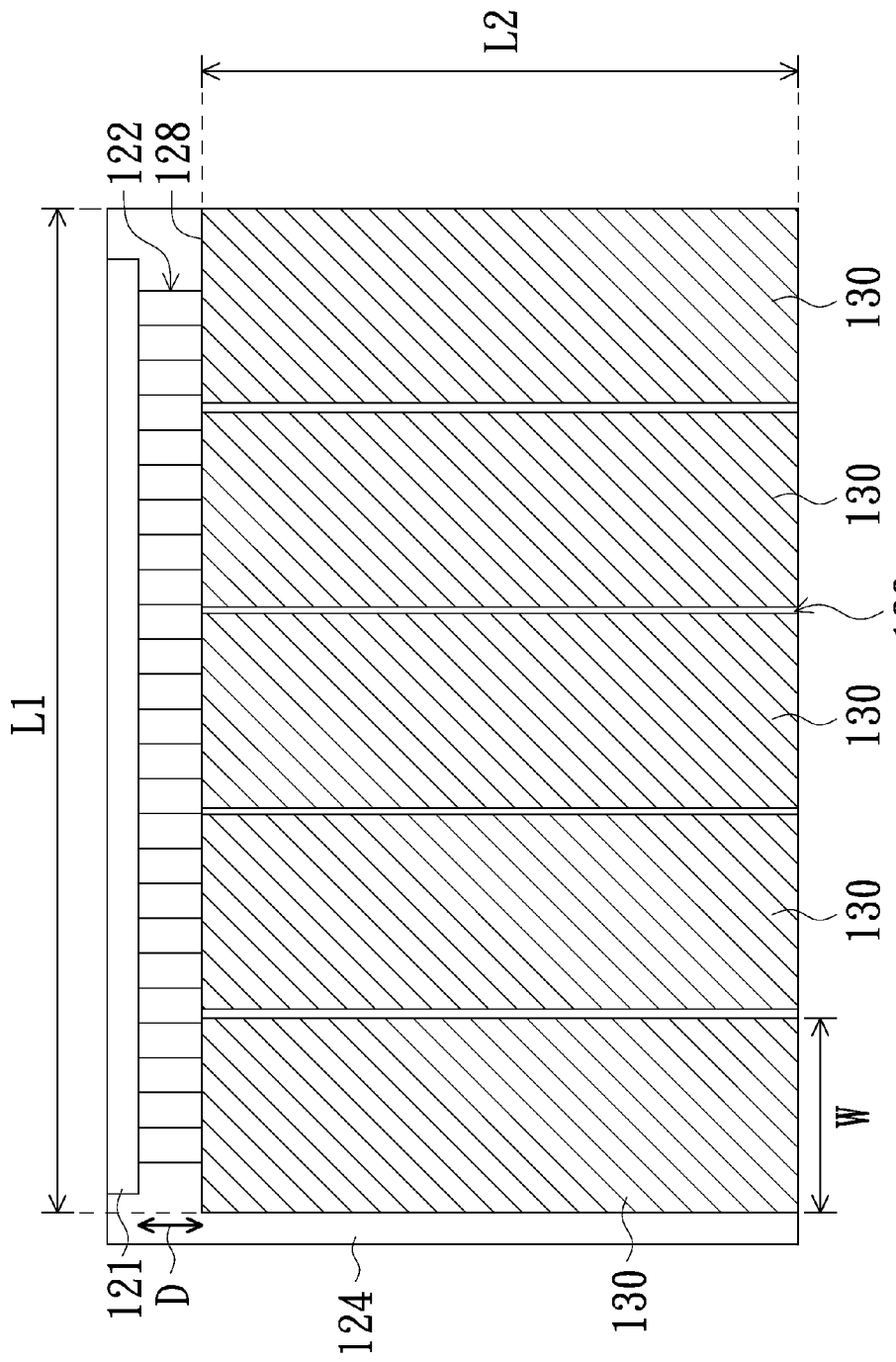

DISPLAY DEVICE AND ASSEMBLY METHOD THEREOF

TECHNICAL FIELD

The present invention relates to a display device and an assembly method thereof.

BACKGROUND

With the development of technology, many kinds of electronic components are widely used to produce electronic products. The electronic components apply electrical energy as power source, and produce a great deal of heat during working. If the heat inside the electronic products cannot be dissipated away in time, the electronic products may get overheated during working.

Taking display devices for example, display panels of the display devices produce heat in operation. The display devices may be an emissive display device or a non-emissive display device. How to avoid the heat accumulating inside the display devices to harm the display panels is a hot topic in this field.

SUMMARY

Therefore, the present invention provides a display device including a rear bezel, a display panel and at least two heat dissipation sheets. The display panel is disposed on the rear bezel. The display panel includes at least one power line having an extension direction. The heat dissipation sheets are disposed between the rear bezel and the display panel. The heat dissipation sheets have at least one seam formed therebetween. The at least one seam is substantially parallel to the extension direction of the at least one power line.

The present invention further provides a display device including a rear bezel, an organic electro-luminescence display panel and at least two heat dissipation sheets. The organic electro-luminescence display panel is disposed on the rear bezel. The organic electro-luminescence display panel includes at least one power line having an extension direction. The organic electro-luminescence display panel has a side edge. The side edge is perpendicular to the extension direction of the at least one power line. The at least two heat dissipation sheets are cut from a heat dissipation coil. The heat dissipation coil has a determinate width smaller than a length of the side edge. The heat dissipation sheets are arranged parallel to the extension direction of the at least one power line along the side edge. The heat dissipation sheets are disposed between the rear bezel and the organic electro-luminescence display panel.

The present invention further provides an assembly method of a display device, comprising steps of:

providing an organic electro-luminescence display panel and a rear bezel, the organic electro-luminescence display panel including a first side edge and a second side edge, a length of the first side edge being longer than that of the second side edge, the organic electro-luminescence display panel including at least one power line having an extension direction, the extension direction of the at least one power line being substantially parallel to the second side edge;

providing a heat dissipation coil, the heat dissipation coil having a determinate width smaller than a length of the first side edge;

cutting the heat dissipation coil into a plurality of heat dissipation sheets according to the length of the second side edge, the heat dissipation sheets attached to one of the rear bezel and the organic electro-luminescence display panel side by side along the first side edge; and attaching the organic electro-luminescence display panel to the rear bezel with the heat dissipation sheets being disposed between the organic electro-luminescence display panel and the rear bezel.

BRIEF DESCRIPTION OF THE DRAWINGS

The present invention will become more readily apparent to those ordinarily skilled in the art after reviewing the following detailed description and accompanying drawings, in which:

FIG. 1 is a schematic, cross-sectional view of a display device according to a first embodiment of the present invention.

FIG. 2 is a schematic view showing the heat dissipation sheets being disposed on the display panel of the display device of FIG. 1.

FIG. 3 is a schematic, cross-sectional view of a display device according to another embodiment of the present invention.

FIG. 4 is a schematic, cross-sectional view of a display device according to a further embodiment of the present invention.

FIGS. 5A to 5D show various steps of assembling a display device according an embodiment of the present invention.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

FIG. 1 is a schematic, cross-sectional view of a display device 100 according to an embodiment of the present invention. The display device 100 includes a rear bezel 110, a display panel 120 and a plurality of heat dissipation sheets 130. FIG. 2 shows the heat dissipation sheets 130 being disposed on the display panel 120. Referring to FIG. 1 and FIG. 2, the display device 100 includes at least two heat dissipation sheets 130. The rear bezel 110 may be made of metal, ceramic or plastic material with good thermal conductivity. In this embodiment, the rear bezel 110 is, for example, made of aluminum. The display panel 120 is disposed on the rear bezel 110. The display panel 120 includes at least one power line 122. The power line 122 has an extension direction D. In this embodiment, there are a plurality of power lines 122, and the extension directions D of the power lines 122 are parallel to each other. The heat dissipation sheets 130 are disposed between the rear bezel 110 and the display panel 120. The heat dissipation sheets 130 are arranged in parallel to each other and a seam 132 is formed between two adjacent heat dissipation sheets 130. The heat dissipation sheets 130 and the seams 132 are substantially parallel to the extension direction(s) D of the power line(s) 122.

Specifically, the display panel 120 has a first side edge L1 and a second side edge L2 perpendicular to and connected with the first side edge L1. A length of the first side edge L1 is longer than that of the second side edge L2. The extension direction(s) D of the power line(s) 122 is(are) substantially parallel to the second side edge L2. The extension direction(s) D of the power line(s) 122 is(are) substantially perpendicular to the first side edge L1. It should be noted that, the number of the heat dissipation sheets 130 shown in FIGS. 1 and 2 is taken as an example to describe clearly, but this is not limited to the number of the heat dissipation sheets 130. The number of the heat dissipation sheets 130 may be defined according to a width W of each of the heat dissipation sheets 130 and the length of the first side edge L1 of the display panel 120. In addition, in this embodiment, the heat dissipation sheets 130 are disposed between a sealing cover 128 of the display panel 120 and the rear bezel 110. The first side edge L1 and the second side edge L2 are actually two neighboring side edges of the sealing cover 128.

Figure 5A:
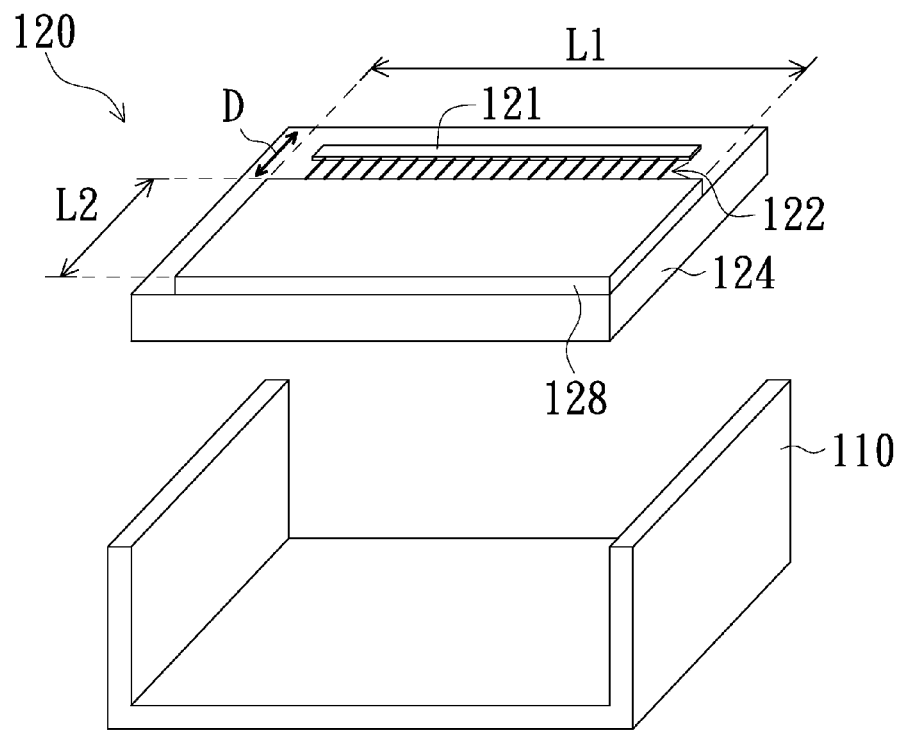
Figure 5B:
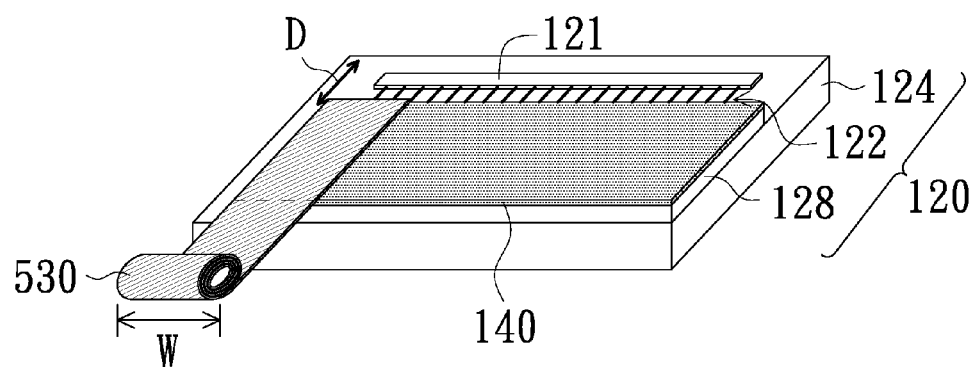

Specially, in this embodiment, the heat dissipation sheets 130 are cut from a heat dissipation coil 530 (shown in FIG. 5B). Generally, the heat dissipation coil 530 has a determinate width, and the width W of the heat dissipation sheets 130 is the same as the determinate width of the heat dissipation coil 530. As FIG. 2 shows, since the width W of the heat dissipation sheets 130 is smaller than the lengths of the first side edge L1 and the second side edge L2, a number of the heat dissipation sheets 130 are provided and attached to the display panel 120 side by side so as to enlarge the dissipation surface of the heat dissipation sheets 130. The heat dissipation sheets 130 may be disposed on the display panel 120 or the rear bezel 110. The heat dissipation sheets 130 are arranged in parallel along the first side edge L1, so that the seams 132 formed between the heat dissipation sheets 130 are parallel to the power line(s) 122.

In details, the display panel 120 includes an array substrate 124, an emissive layer 126 and a sealing cover 128. The power line(s) 122 is(are) disposed on the array substrate 124. Specially, an active element array (not shown) is formed on the array substrate 124 to control the display panel 120 to show images. The power line(s) 122 electrically connects (connect) the active element array and the power supply circuit 121, so that the power supply circuit 121 can supply electrical energy to the active element array by the power line(s) 122. In this embodiment, the active element array formed on the array substrate 124 is a thin film transistors array (TFTs array).

The emissive layer 126 is disposed on the array substrate 124, and the sealing cover 128 covers on the array substrate 124. The emissive layer 126 is thus sealed in a space formed between the sealing cover 128 and the array substrate 124, so as to prevent the emissive layer 126 from water vapor. In addition, in this embodiment, the array substrate 124 is positioned at the display side of the display panel 120, and the sealing cover 128 faces the rear bezel 110. In other words, the sealing cover 128 is disposed between the emissive layer 126 and the rear bezel 110.

Specifically, the emissive layer 126 may be an organic electro-luminescence display (OELD) layer, and is driven by the current inflowing into the display panel 120 through the power line(s) 122. The display panel 120 generates a lot of heat as the current flows in the display panel 120, and the heat causes the display panel 120 to be overheated. At this time, the heat must be transferred out from the display panel 120. This can avoid the heat accumulating inside the display panel 120 to accelerate aging of the emissive layer 126, while the aging emissive layer 126 would affect uniformity of the displayed images. In this embodiment, the heat dissipation sheets 130 are disposed between the sealing cover 128 and the rear bezel 110. Thus, the heat inside the display panel 120 can be transferred to the heat dissipation sheets 130 by the sealing cover 128. The heat dissipation sheets 130 with a large coefficient of heat transfer dissipate the heat to the rear bezel 110, so as to homogenize the temperature inside the display panel 120. While the current flowing through the power line(s) 122 produces heat inside the display panel 120, the heat dissipation sheets 130 dissipates the heat to the rear bezel 110 along the extension directions D of the power line(s) 122. Since the seams 132 among the heat dissipation sheets 130 are substantially parallel to the power line(s) 122 of the display panel 120, the seams 132 are avoided to affect the continuous heat dissipation of the heat dissipation sheets 130. This can homogenize the temperature of the display panel 120.

Figure 3:
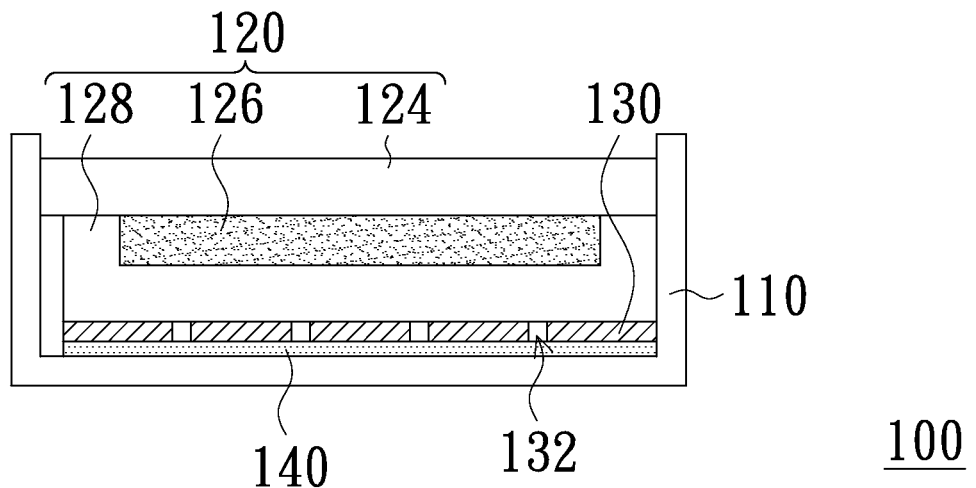

In this embodiment, the coefficient of heat transfer of the heat dissipation sheets 130 is larger than 200 W/m-K, advantageously, larger than 500 W/m-K. Specially, the heat dissipation sheets 130 may be made of metal, ceramic or graphite. In addition, in this embodiment, the heat dissipation sheets 130 may, without limitation, be attached to the display panel 120 by adhesive 140, e.g., double faced adhesive tape. The adhesive 140 is sandwiched between the display panel 120 and the heat dissipation sheets 130. In other embodiments, referring to FIG. 3, the heat dissipation sheets 130 are attached to the rear bezel 110 by the adhesive 140, with the adhesive 140 being sandwiched between the rear bezel 110 and the heat dissipation sheets 130.

Figure 4:
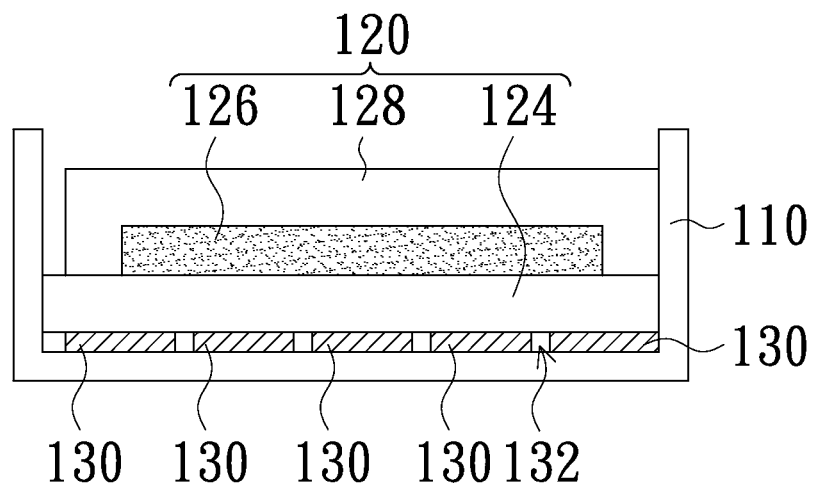

In addition, referring to FIG. 4, in another embodiment, the sealing cover 128 is positioned at the display side of the display panel 120, and the array substrate 124 faces the rear bezel 110. In other words, the array substrate 124 is disposed between the emissive layer 126 and the rear bezel 110, and the heat dissipation sheets 130 is disposed between the array substrate 124 and the rear bezel 110. The first side edge L1 and the second side edge L2 of the display panel 120 are two adjacent side edges of the array substrate 124.

In order to describe more clearly, an assembly method of the above display device 100 is described as follow accompanying drawings.

FIGS. 5A to 5D show various steps of assembling the display device according to an embodiment of the present invention. Referring to FIG. 5A, a display panel 120 and a rear bezel 110 are provided. The display panel 120 includes a first side edge L1 and a second side edge L2. A length of the first side edge L1 is larger than that of the second side edge L2. As described above, the display panel 120 includes an array substrate 124, an emissive layer 126 and a sealing cover 128. At least one power line 122 is disposed on the array substrate 124. The extension direction D of the power line 122 is substantially parallel to the second side edge L2. In this embodiment, there are a plurality of power lines 22 which are substantially parallel to the second side edge L2. In other words, the power lines 122 are disposed on the array substrate 124, and the extension directions D of the power lines 122 are substantially parallel to each other.

Referring to FIG. 5B, a heat dissipation coil 530 is provided, with a determinate width W smaller than the length of the first side edge L1 of the display panel 120. The heat dissipation coil 530 is unfurled and the unfurled portion is then attached to the display panel 120 in a direction parallel to the second side edge L2. In other words, the width direction of the heat dissipation coil 530 is paralleled to the second side edge L2. The unfurled portion is cut off the heat dissipation coil 530 according to the length of the second side edge L2, thus obtaining a heat dissipation sheet 130 on the display panel 120 with a length of the heat dissipation sheet 130 equaling to that of the second side edge L2 of the display panel 120. In addition, the adhesive 140 may be coated on the display panel 120 in advance, so that the heat dissipation sheet 130 can be directly adhered to the display panel 120.

Figure 5C:
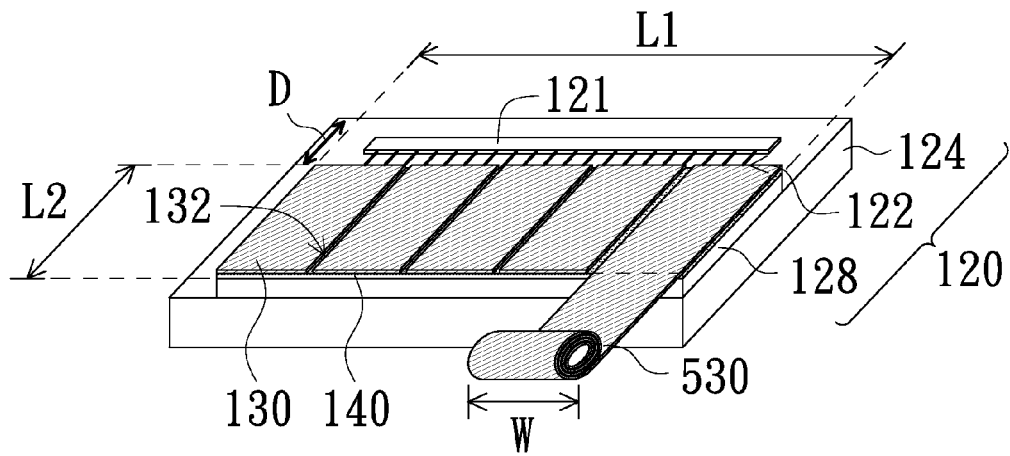

With repeating above operations, a plurality of the heat dissipation sheets 130 are arranged on the display panel 120 along the first side edge L1, and the heat dissipation sheet 130 are parallel to the second side edge L2, as shown in FIG. 5C.

As result, the seam 132 formed between two adjacent heat dissipation sheets 130 is substantially parallel to the extension direction(s) D of the power line(s) 122.

The heat dissipation coil 530 is selectively attached to the array substrate 124 or the sealing cover 128 according to the positions of the array substrate 124 and the sealing cover 128. In this embodiment, the array substrate 124 is disposed at the display side of the display panel 120, and the heat dissipation coil 530 is attached to the sealing cover 128. In another embodiment, the sealing cover 128 is disposed at the display side of the display panel 120, and the heat dissipation coil 530 is attached to a surface of the array substrate 124.

In addition, in this embodiment, the heat dissipation coil 530 is attached to the display panel 120 and then the heat dissipation coil 530 is unfurled and cut according to the length of the second side edge L2 of the display panel 120. In other embodiment, the heat dissipation coil 530 is cut into a plurality of heat dissipation sheets 130 according to the length of the second side edge L2 of the display panel 120 in advance, and the heat dissipation sheets 130 are then attached to the display panel 120 along the first side edge L1.

In the assembly method, the heat dissipation coil 530 is attached to the display panel 120, for example. However, it should be understood for one skilled in the art that the heat dissipation coil 530 also can be attached to the rear bezel 110. In case that the heat dissipation coil 530 is attached to the rear bezel 110, the heat dissipation coil 530 is cut into a plurality of the heat dissipation sheets 130 according to the length of the second side edge L2 of the array substrate 124 or the sealing cover 128 in contact with the rear bezel 110. The adhesive 140 is coated on the rear bezel 110 in advance and the heat dissipation sheets 130 are then attached to the rear bezel 110. The other details have been described above, and they are not described again here.

Figure 5D:
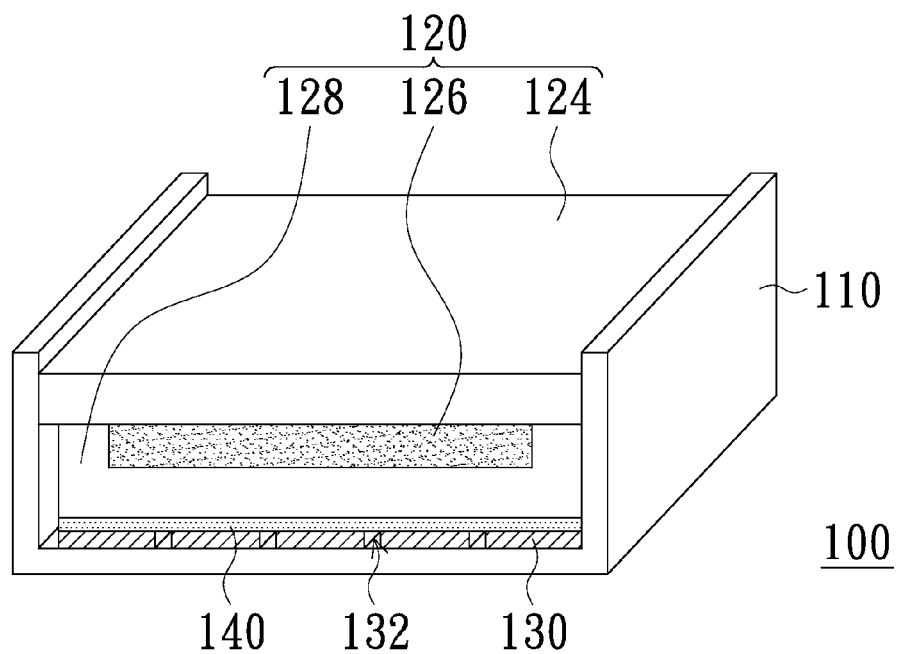

Referring to FIG. 5D, the display panel 120 is attached to the rear bezel 110, so that the heat dissipation sheets 130 are disposed between the display panel 120 and the rear bezel 110. The assembly of the display device 100 is completed here.

In summary, according to the display device of the present invention, at least two heat dissipation sheets are disposed between the display panel and the rear bezel, and the seam formed between two adjacent heat dissipation sheets is substantially parallel to the extension directions of the power line(s) on the display panel. This can avoid the heat inside the display panel cannot be continuously dissipated by the heat dissipation sheets because of the seams extending across the dissipation paths of the heat dissipation sheets. Thus, the uniformity of the temperature of the display panel is improved, which can improve quality of images shown by the display device and prolong the service time of the display device.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:
1. A display device, comprising:
a rear bezel;
a display panel disposed on the rear bezel, the display panel including at least one power line having an extension direction, wherein the display panel comprises an emissive layer; and
at least two heat dissipation sheets disposed between the rear bezel and the display panel, the heat dissipation sheets having at least one seam formed therebetween, the at least one seam being parallel to the extension direction of the at least one power line, wherein a first heat dissipation sheet of the at least two heat dissipation sheets covers a length of the power line on the emissive layer, and a length of the first heat dissipation sheet in the direction of the seam is not smaller than the length of the power line on the emissive layer.

2. The display device according to claim 1, wherein the at least one power line comprises a plurality of power lines, and the extension directions of the power lines being substantially parallel to each other.

3. The display device according to claim 2, wherein the display panel further comprises:
an array substrate, the power lines disposed on the array substrate;
the emissive layer disposed on the array substrate; and
a sealing cover disposed on the array substrate and located between the emissive layer and the rear bezel, the heat dissipation sheets disposed between the sealing cover and the rear bezel.

4. The display device according to claim 2, wherein the display panel further comprises:
an array substrate, the power lines disposed on the array substrate;
the emissive layer disposed on the array substrate; and
a sealing cover disposed on the array substrate, the array substrate disposed between the emissive layer and the rear bezel, the heat dissipation sheets disposed between the array substrate and the rear bezel.

5. The display device according to claim 1, further comprising a first adhesive, wherein the first adhesive is disposed between each of the heat dissipation sheets and the rear bezel.

6. The display device according to claim 5, further comprising a second adhesive, wherein the second adhesive is disposed between each of the heat dissipation sheets and the display panel.

7. The display device according to claim 1, wherein a coefficient of heat transfer of the heat dissipation sheets is larger than 200 W/m-K.

8. The display device according to claim 1, wherein the heat dissipation sheets are made of metal, ceramic or graphite.

9. The display device according to claim 1, wherein the seam is formed by the heat dissipation sheets, the rear bezel and the display panel.

10. An display device, comprising:
a rear bezel;
an organic electro-luminescence display panel disposed on the rear bezel, the organic electro-luminescence display panel including at least one power line having an extension direction, the organic electro-luminescence display panel having a side edge, the side edge being perpendicular to the extension direction of the at least one power line; and
at least two heat dissipation sheets being cut from a heat dissipation coil, the heat dissipation coil having a determinate width smaller than a length of the side edge, the heat dissipation sheets being arranged parallel to the extension direction of the at least one power line along the side edge, the heat dissipation sheets disposed between the rear bezel and the organic electro-luminescence display panel wherein the organic electro-luminescence display panel comprises an organic electro-luminescence layer, a first heat dissipation sheet of the at least two heat dissipation sheets covers a length of the power line on the organic electro-luminescence layer, and a length of the first heat dissipation sheet in the direction of the seam is not smaller than the length of the power line on the organic electro-luminescence layer.

11. The display device according to claim 10, wherein the at least one power line comprises a plurality of power lines, and the extension directions of the power lines being substantially parallel to each other.

12. The display device according to claim 11, further comprising a first adhesive, wherein the first adhesive is disposed between each of the heat dissipation sheets and the rear bezel.

13. The display device according to claim 12, wherein the display panel further comprises:
   an array substrate, the power lines disposed on the array substrate;
   the organic electro-luminescence layer disposed on the array substrate; and
   a sealing cover disposed on the array substrate and located between the organic electro-luminescence layer and the rear bezel, the heat dissipation sheets disposed between the sealing cover and the rear bezel.

14. The display device according to claim 12, wherein the display panel further comprises:
   an array substrate, the power lines disposed on the array substrate;
   the organic electro-luminescence layer disposed on the array substrate; and
   a sealing cover disposed on the array substrate, the array substrate disposed between the organic electro-luminescence layer and the rear bezel, the heat dissipation sheets disposed between the array substrate and the rear bezel.

15. The display device according to claim 11, further comprising a second adhesive, wherein the second adhesive is disposed between each of the heat dissipation sheets and the display panel.

16. The display device according to claim 11, wherein a coefficient of heat transfer of the heat dissipation sheets is larger than 200 W/m-K.

17. The display device according to claim 11, wherein the heat dissipation sheets are made of metal, ceramic or graphite.

* * * * *